Figure 1:
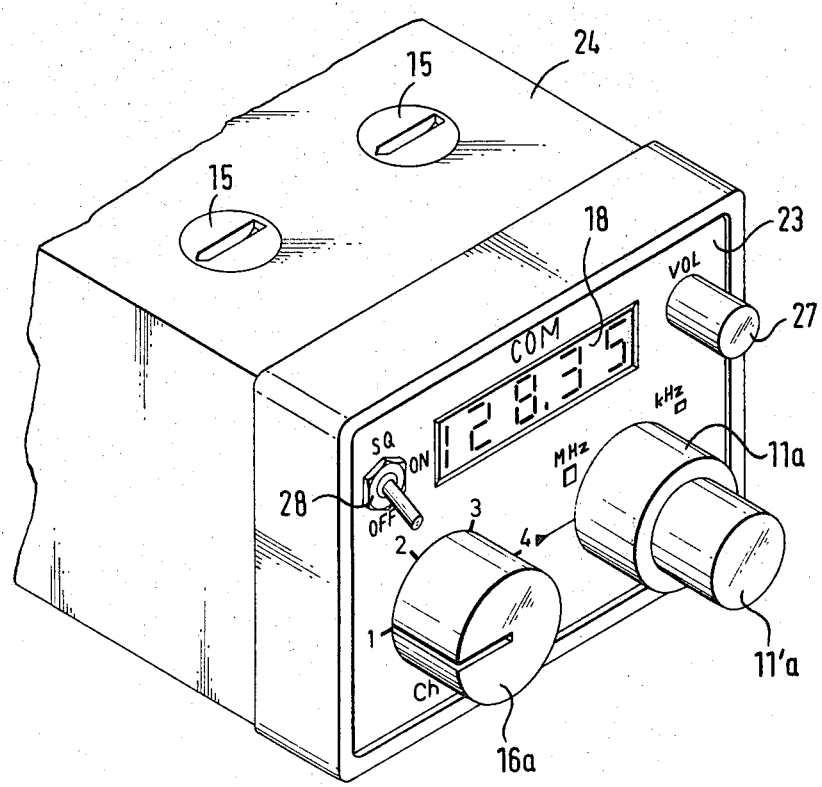

United States Patent [19]

Krämer et al.

[11] 4,357,710

[45] Nov. 2, 1982

[54] RADIO APPARATUS

[75] Inventors: Ludwig Krämer, Windach; Otto Franz; Walter Lotze, both of Landsberg, all of Fed. Rep. of Germany

[73] Assignee: Walter Dittel GmbH Luftfahrtgeratebau, Landsberg, Fed. Rep. of Germany

[21] Appl. No.: 132,450

[22] Filed: Mar. 21, 1980

[30] Foreign Application Priority Data

Apr. 3, 1979 [DE] Fed. Rep. of Germany ....... 2913366

[51] Int. Cl.³ .............................................. H04B 1/38
[52] U.S. Cl. ...................................... 455/76; 455/77; 455/90; 455/158; 455/175; 455/183; 455/348
[58] Field of Search ...................................... 455/75–77, 455/120, 123, 125, 157, 158, 160, 170, 173, 175, 183, 90, 348

[56] References Cited

U.S. PATENT DOCUMENTS

| | | | |
|---|---|---|---|
| 2,229,920 | 1/1941 | Gedde | 455/160 |
| 3,696,422 | 10/1972 | Burrell | 455/76 |
| 3,758,751 | 9/1973 | Buecker | 455/158 |
| 3,835,384 | 9/1974 | Liff | 455/173 |

FOREIGN PATENT DOCUMENTS

622158  4/1949  United Kingdom ................ 455/175

*Primary Examiner*—Marc E. Bookbinder
*Attorney, Agent, or Firm*—Townsend and Townsend

[57] ABSTRACT

Radio apparatus and in particular VHF transmitter and receiver apparatus for aeronautical use comprises a frequency synthesizer 17 which is able to generate any desired frequency within the range of the radio and a number of frequency channel selection devices. These selection devices include a channel tuning switch 11, 11' which is arranged on the front panel of the apparatus and which can be adjusted to select any desired channel within the frequency range of the radio and a number of channel selectors 12, 12'; 13, 13'; 14, 14' which can be preset to call up certain fixed channels as desired. A changeover switch 16a at the front panel of the apparatus makes it possible to select any one of the channel selectors 12, 12'; 13, 13'; 14, 14' or the channel tuning switch 11, 11'. All the channel tuning devices are of similar construction and are mechanical stepping switches but the adjustment devices for the fixed channel selectors can only be actuated by means of tools. The selected channel is indicated on a liquid crystal display 18.

6 Claims, 4 Drawing Figures

RADIO APPARATUS

The present invention relates to radio apparatus and in particular to VHF transmitter and reciever apparatus for aeronautical radio.

Known apparatus of this kind comprises a frequency synthesiser, a channel tuning switch arranged at the front side of the apparatus for selecting any desired channel in a predetermined frequency range, at least one channel selector for tuning in a fixed channel and a change-over switch for changing over from the channel tuning switch to said at least one channel selector and vice versa. The change-over switch is also arranged on the front side of the apparatus.

The radio apparatus to which the present invention is directed is particularly designed to be suitable for operation in powered aircraft and in gliders where particular attention must be paid to the cost, value for money and the simple foolproof serviceability of the apparatus.

One similar type of radio apparatus is already known which has ten allocations for fixed channel tuning which can at once be called into use as required by movement of the change-over switch. The apparatus is however very complex to manufacture and accordingly expensive. It also occupies a large volume and is heavy. The current consumed is so considerable that its use in gliders cannot be entertained. For glider operation particular use has been made of radio apparatus using individual quartz crystals which are very inexpensive, which take up little space and which are also characterized by their low weight. The current requirement of such apparatus is also relatively low. However only a limited quantity of individual quartz crystals can be housed on the switching drum of such apparatus so that only a small number of channels can be selected from the 720 frequency channels which are available in the VHF aeronautical radio range. Frequency change by the exchange of crystals is only permitted to be carried out in the works of the manufacturer or by an aeronautical engineering firm. Such exchange is therefore very involved. A particular problem also arises due to the very long delivery times for the individual quartz crystals.

VHF transmitter and reciever apparatus for aeronautical radio is also already known in which all 720 channels can be tuned by push buttons or by turn knobs. These devices are also relatively good value for money, take up only a small space are of low weight and draw only a small current. Their disadvantage is however that the frequency to be selected must previously have been noted down somewhere or must be looked up and that tuning itself requires the attention of the operator. A diversion of the pilot's attention is however, not acceptable particularly during critical flight situations.

The principal object underlying the present invention is thus to provide a radio apparatus of the kind initially named which, despite inexpensive, unproblematic, compact and light-weight construction, enables the operator not only to tune to a desired channel inside the available frequency range but also to call up one or more predeterminable frequency channels which can be selected by the operator as desired without it being necessary to engage in a long search across the frequency scale.

To accomplish this object the invention envisages, in radio apparatus of the above named kind that both channel tuning switch and said at least one channel selector are similar mechanical stepping switches, that the adjustment devices for the channel selector stepping switches can only be actuated by means of tools and that the change-over switch connects either the channel tuning switch or one of the channel selector stepping switches to the frequency synthesiser and to a liquid crystal display of the apparatus, said display being adapted to indicate the channel selected.

The mechanical stepping switches are preferably rotary stepping switches of the binary coding kind.

As a result of this arrangement a desired frequency channel can be selected in the customary manner by considering the frequency display which is however, in accordance with the invention, constructed as a liquid crystal display in order to keep the current requirements extremely low and also to achieve independence from the channel tuning switch. The channel selector stepping switches of the present invention can advantageously likewise be pretuned to desired frequency channels within the frequency range. The channel selectors can be called up at any time by actuation of the change-over switch without particular attention by the user inplace of the frequency channels which can be tuned in by the channel tuning switch. The invention can also be regarded as providing two or more frequency coding switches which can be selectively connected to the frequency synthesiser and of which one is the customary externally accessible channel tuning switch whilst the other is arranged within the apparatus and is only accessible when the apparatus is removed from its installed position. Restrictions with respect to the frequency channels that are available do not thus exist either when tuning the channels with the aid of the channel tuning switch or during the selection of specified channels.

It is particularly advantageous if the channel tuning switch and each channel selector switch each consists of two interconnected stepping switches of which the one serves for MHz tuning and the other for KHz tuning.

A particularly advantageous embodiment is characterized in that the channel selector switches are arranged near to one side of the housing and indeed preferably near to the upper or lower sides of the housing. In this arrangement each pair of associated channel selector stepping switches are usefully arranged alongside one another or concentrically of each other whilst various channel selector stepping switches are arranged behind each other.

The invention thus consciously renounces the mechanical coupling of the channel tuning switch with a mechanical display as was customary for the previously known good value, compact and light-weight radios. In each case a KHz and a MHz switch, which are extensively similarly constructed, are attached in the form of injection molded plactic parts directly to a printed circuit board. The frequency display is constructed as a liquid crystal display. This display draws only extremely small currents and can also be easily read even with very light surroundings. If required additional illumination can also be used with automatic or manual brightness control.

The MHz and KHz switches of the channel tuning switch, which is accessible from the front side of the apparatus, are usefully arranged concentrically to one another and can be actuated via two concentric actuation knobs at the front side of the apparatus. To embrace the full 720 channels of the aeronautical radio VF range all the MHz switches should have 18 switching steps and KHz switches 40 switching steps which are provided by mechanical abutments in the switching mechanism of the MHz switch. For tuning adjustments by means of roatable knobs the desired frequency can be tuned with particular sensitivity, even during turbulence or when wearing gloves by choice of suitable gearing.

The channel selector stepping switches are advantageously only easily accessible after the apparatus has been removed from its mount. The channel selector stepping switches can easily be programmed by the operator by means of a coin or a screw driver by calibrating the switches in terms of frequency or channel numbers. As soon as the change-over switch has been changed over to the relevant channel selector stepping switch the selected frequency likewise appears on the liquid crystal display.

For the special case of the ground station the programable channel selector storage switches are preset by the manufacturer or by an aeronautical engineering organisation and are sealed. In this way a flight apparatus can at any time and without further ado also be used, in accordance with the conditions of the Federal Institute for Flight Safety, in a ground station. For this purpose all 720 channels can for example be prepared for reception whilst transmission can only take place on the programmed and sealed frequencies. On the other side of the coin a ground apparatus can at any time once more be converted into a flight apparatus by releasing the seals in an approved works.

Figure 2:
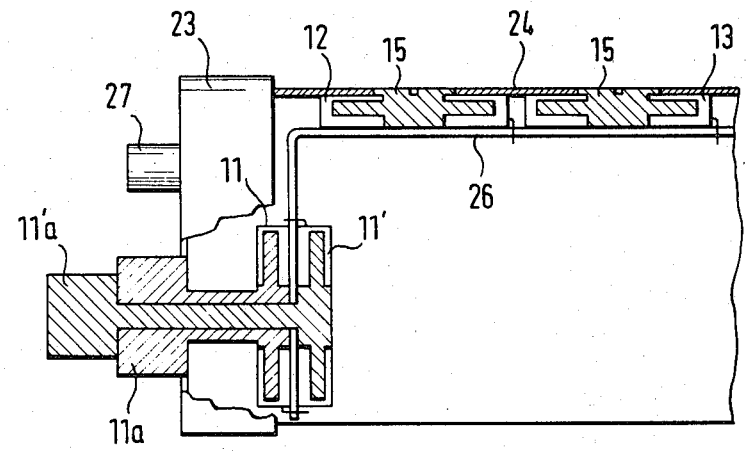
Figure 3:
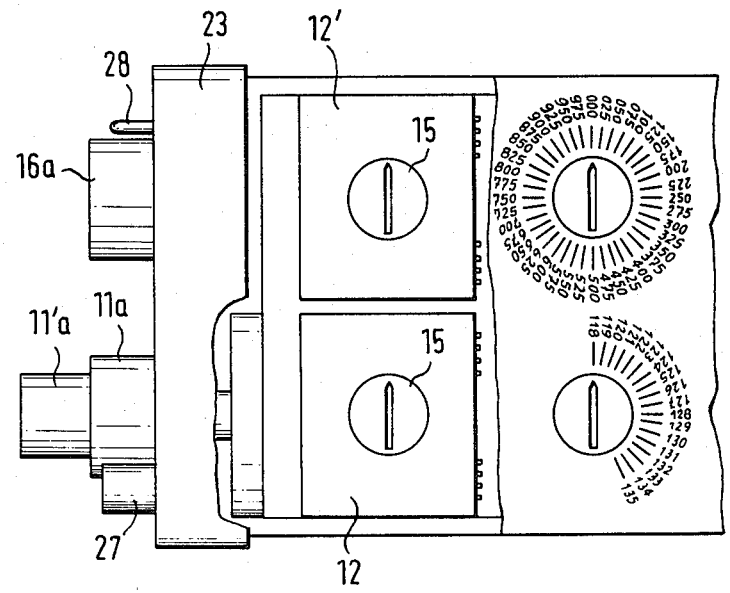
Figure 4:
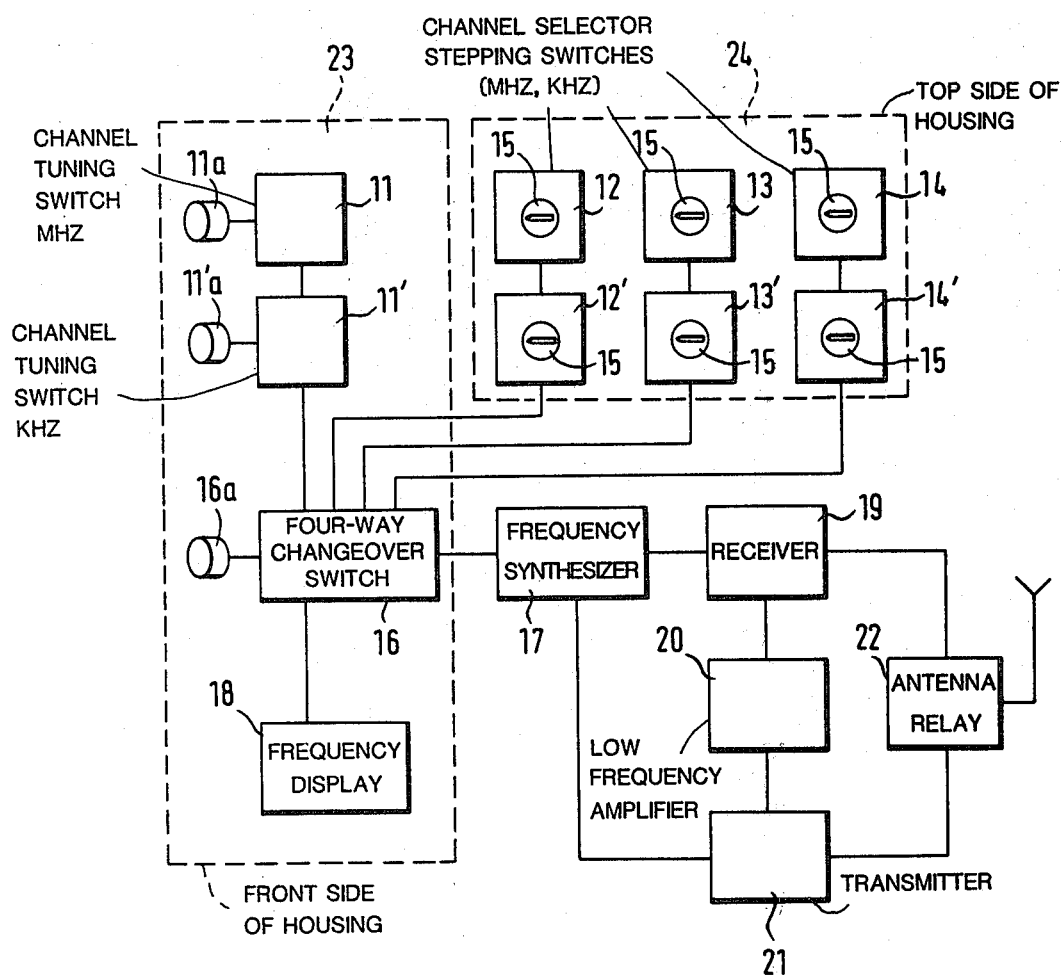

The apparatus will now be described in the following by way of example only and with reference to the drawings which show:

FIG. 1—a perspective view of the front portion of an aeronautical radio apparatus in accordance with the invention, FIG. 2—a longitudinal section through the apparatus illustrated in Fig. 1 and taken along the axis of the channel tuning switch, FIG. 3—a partially broken away plan view of the apparatus of Figs. 1 and 2 and FIG. 4—a block circuit diagram of the radio apparatus of the invention Referring th the drawings a frequency channel display 18 which is constructed as a liquid crystal display, can be seen located on the front side of an aeronautical radio apparatus. The liquid crystal display 18 is connected, as seen in Fig. 4, to the channel selector stepping switch 16 which is in turn connected with a frequency synthesiser 17 which is itself connected in the customary manner as can be seen from Fig. 4 with a reciever 19, a low frequency amplifier 20, a transmitter 21 and an antenna relay 22. The front panel is indicated in Fig. 4 by a broken line frame 23 and the upper side of the apparatus by a broken line frame 24.

As seen in Fig. 4 the frequency synthesiser 17 is connected via a four-way change-over switch 16 with several parallel connected stepping switches. The channel change-over switch is actuated externally via an actuation knob 16a as seen in Fig. 1.

In the position 4 the change over switch 16 connects two binary coding switches 11, 11' with the synthesiser 17. The coding switch 11 is actuatable in accordance with Fig. 1 from the outside by means of a rotatable knob 11a and furthermore includes 18 steps for sweeping over the aeronatical radio MHz range.

As seen in Fig. 2 the KHz coding switch 11' is arranged coaxially to and behind the stepping switch 11. The actuating shaft for this coding switch passes through an axial bore in the actuation knob 11a and finishes at a rotational actuating knob 11'a which is externally accessible and which is concentric with the ring-like actuation knob 11a.

The coding switches 11, 11' are so applied to the synthesiser 17 via the change-over switch 16 that every desired frequency channel within the 720 channel range can be selected by a corresponding coarse adjustment by means of the rotatable knob 11a and a fine adjustment by means of the knob 11'a. The tuned frequency is shown on the liquid crystal display 18.

Thus desired channels within the VHF range can be tuned when the change over switch 16 is in the position 4.

In accordance with the invention, and as seen in Figs. 2 to 4, a plurality of stepping coding switches 12, 12', 13, 13', 14, 14' are housed in the upper side 24 of the apparatus with their flat sides parallel to the side of the housing. Each two coding switches 12, 12'; 13, 13'; 14, 14' are connected together in pairs in the same manner as the coding switches 11, 11'. The coding switches are also identically conctructed apart from the fact that they are not actuatable by externally accessible adjustment knobs. Instead each coding switch 12, 12', 13, 13', 14, 14' has an adjustment member 15 which can for eample be actuated by means of a screw driver and by means of which, in the same way as the coding switches 11, 11', all 720 channels can however be selected. Fig. 3 shows, with reference to the second coding switch pair 13, 13' how small frequency scales can be applied to the adjustment members 15 so that the tuning to a specific frequency channel can also be straightforwardly effected by the user himself.

As seen in Figs. 2 and 3 the coding switches 12 to 14 are installed parallel to the housing wall 24 in such a way that the adjustment members 15 are substantially flush with the external surface. If the apparatus is pushed into a mount in the customary manner then the adjustment members 15 are no longer accessible. When the apparatus is removed from the mount the adjustment members 15 can however be adjusted by means of a tool The change-over switch 16 now makes it possible, by changing it over to the positions 1,2 or 3 by means of the knob 16a, to connect the stepping coding switch pairs 12, 12'; 13, 13'; 14, 14' to the synthesiser 17 as desired. The pretuned frequency channels determined by the individual pairs can thus be selected by means of a single switching step through the knob 16a. This selection can be effected by the user solely on the basis of the sequential indexing of the knob 16a without looking so that, it is possible to quickly and reliably call up a preselected channel even in critical situations.

Although in principle a single additional fixed channel is sufficient three pretunable fixed channels are however preferred, as shown in the exemplary embodiment of the present invention, because this represents a reasonable compromise between an apparatus which is not too complex and an apparatus which can be used in a sufficiently universal manner.

A volume control knob 27 and an on-off switch 28 are also arranged on the front panel 23.

As seen in FIG.2 all the rotatable coding stepping switches 11, 11', 12, 12', 13, 13', 14, 14' are preferably attached to a common printed circuit board 26 which is bent downwardly in the vicinity of the front panel 23.

It will be appreciated by those skilled in the art that other modifications can be made to the apparatus herein disclosed and described without departing from the scope of the present teaching.

I claim:

1. Radio apparatus, in particular VHF transmitter and receiver apparatus for aeronautical radio, the apparatus comprising a housing having a front side and adapted to be received in a mounting, a frequency synthesizer, a channel tuning switch arranged at said front side of the housing for selecting any desired channel in a predetermined frequency range, at least one channel selector for tuning in a fixed channel, adjustment means in respect of said at least one channel selector, a changeover switch for effecting changeover between the channel tuning switch and said at least one channel selector and a liquid crystal display adapted to indicate the channel selected and wherein said channel tuning switch and said at least one channel selector are similar mechanical stepping switches, said adjustment means for said at least one channel selector only being actuated by means of tools, said adjustment means further being only accessible when the housing is withdrawn from said mounting and wherein said change-over switch connects either said channel tuning switch or said at least one channel selector to the frequency synthesizer and to said liquid crystal display.

2. Radio apparatus according to claim 1, wherein the stepping switches are rotatable binary coding switches.

3. Radio apparatus according to claim 1, wherein means are provided for sealing said at least one channel selector.

4. Radio apparatus according to claim 1 wherein the channel tuning switch and said at least one channel selector each consist of two interconnected stepping switches of which the one serves for MHz tuning and the other for KHz tuning.

5. Radio apparatus according to claim 1, wherein said at least one channel selector is arranged near to one of the housing sides.

6. Radio apparatus according to claim 1, wherein a plurality of channel selectors is provided and wherein said changeover switch is a rotatable switch having several positions and rotatable from a first position corresponding to said channel tuning switch to further positions each corresponding to a respective one of said plurality of channel selectors.

* * * * *